US010745023B2

(12) United States Patent
Srivastava et al.

(10) Patent No.: US 10,745,023 B2
(45) Date of Patent: Aug. 18, 2020

(54) FUNCTIONAL SAFETY POWER SUPPLY FRAMEWORK FOR REAL-TIME AUTOMOTIVE SYSTEMS (71) Applicant: INTEL CORPORATION, Santa Clara, CA (US)

(72) Inventors: Amit Kumar Srivastava, Folsom, CA (US); Asad Azam, Folsom, CA (US); Jagannadha Rapeta, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/021,911

(22) Filed: Jun. 28, 2018

(65) Prior Publication Data
US 2020/0001887 A1 Jan. 2, 2020

(51) Int. Cl.
B60W 50/02 (2012.01)
H03K 3/037 (2006.01)
H03K 5/24 (2006.01)
G01R 19/165 (2006.01)
G01R 19/12 (2006.01)
B60W 50/00 (2006.01)
B60R 16/03 (2006.01)

(52) U.S. Cl.
CPC .... B60W 50/0205 (2013.01); B60W 50/0098 (2013.01); B60W 50/0225 (2013.01); G01R 19/12 (2013.01); G01R 19/16528 (2013.01); G01R 19/16538 (2013.01); H03K 3/037 (2013.01); H03K 5/24 (2013.01); B60R 16/03 (2013.01)

(58) Field of Classification Search
None
See application file for complete search history.

(56) References Cited

U.S. PATENT DOCUMENTS

| 7,225,349 | B2 * | 5/2007 | Tam ........................ G06F 1/04 327/101 |
| 7,528,619 | B2 | 5/2009 | Paillet et al. |
| 9,213,382 | B2 * | 12/2015 | Paillet ...................... G05F 1/56 |
| 10,145,868 | B2 * | 12/2018 | Chong ................... G01R 17/02 |
| 2010/0229021 | A1 | 9/2010 | Konstadinidis et al. |
| 2017/0005665 | A1 | 1/2017 | Swaminathan et al. |
| 2017/0357309 | A1 | 12/2017 | Wu et al. |
| 2018/0067532 | A1 | 3/2018 | Chuang et al. |
| 2019/0052277 | A1 * | 2/2019 | Rapeta .................. H03L 7/0807 |
| 2019/0317546 | A1 * | 10/2019 | Born .................. H03K 5/00006 |

FOREIGN PATENT DOCUMENTS

WO    2017222620 A1    12/2017

OTHER PUBLICATIONS

International Search Report and Written Opinion for the International Patent Application No. PCT/US2019/034631, dated Nov. 20, 2019, 15 pages.

* cited by examiner

Primary Examiner — Cassandra F Cox (57) ABSTRACT

A voltage monitoring framework is proposed to predict, report, and correct actions for performance impacting voltage droop due to power supplies in a system-on-a-chip. Both the amplitude and duration of the voltage droop are monitored. By predicting serious voltage droops early, power supplies cross check against each other to avoid catastrophic error, thus ensuring that integrated circuits making up the system-on-a-chip will maintain functional reliability.

13 Claims, 11 Drawing Sheets

Figure 10

FUNCTIONAL SAFETY POWER SUPPLY FRAMEWORK FOR REAL-TIME AUTOMOTIVE SYSTEMS

TECHNICAL FIELD

Embodiments described herein relate to system-on-chip (SoC) applications and, more particularly, to management of power supply voltage droop during system operation.

BACKGROUND

Advanced driver-assistance systems (ADAS) are features of some automobiles to reduce the human error associated with driving. ADAS may include safety features that alert drivers as well as automatic features. Automotive Safety Integrity Level (ASIL) is a risk classification scheme, and is divided into standards A, B, C, and D, with ASIL-D being the most rigorous safety requirement standard.

The Internet of Things (IoT) is a network of devices embedded with electronics, software, and sensors to enable the exchange and analysis of data. Many IoT devices operate using a system-on-a-chip (SoC), which includes processor cores as well as memory controller, input/output ports, video, graphics, and so on, on a single chip. SoC-based IoT devices are used in the automobile industry, with SoC-enabled vehicles sharing data with the cloud, infrastructure, and other vehicles.

IoT systems targeting automotive and industrial segments may feature ADAS, and these devices are designed according to the highest ASIL standard, ASIL-D. This ensures that the real-time IoT device performs safely and reliably under complex and noisy environments during the product's life cycle. A robust safety solution would involve diagnosis and early reporting of faults to a system agent so that the IoT device may be parked safely or put into a recovery state or reset states. One of the fault conditions to consider is power supply voltage droop.

Power-based systems are designed to address changes in current requirements at the load. A microprocessor load, for example, may change its current consumption by 50 amps or more in a fraction of a nanosecond, or a single cycle. This current spike causes voltage variations or spikes, known as droops, on the power supply. A droop is defined as steady state output voltage change as a function of time and may include both under-voltage and over-voltage conditions.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a voltage monitoring framework is proposed to predict, report, and correct actions for performance impacting voltage droop in an automotive system. Both the amplitude and duration of the voltage droop are monitored. By predicting serious voltage droops early, catastrophic error may be avoided, thus ensuring that integrated circuits making up the automotive system will maintain functional reliability.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. In other instances, well-known structures, materials, or operations are not shown or described in detail to avoid obscuring aspects of the disclosure. The following detailed description is, therefore, not to be construed in a limiting sense, as the scope of the subject matter is defined by the claims.

Voltage droop is characterized by steady state power supply output voltage changes due to transient change in output loads of a power supply. When there is a big surge in current due to output load, there may be a dip in the steady state voltage being supplied by the voltage source, and this is known as voltage droop. Killer voltage droop is the limit of a voltage droop beyond a threshold voltage and threshold droop voltage time, where system components start failing. Because systems vary significantly, a killer voltage for one system may not be a killer voltage for another system. Thus, in one system, a voltage droop that exceeds +/−100 mV for at least 4 ns is deemed a killer voltage droop. In a second system, a voltage droop that exceeds +/−200 mV for at least 2 ns is deemed a killer voltage droop.

Power supply voltage droop, one possible source of fault within a system on chip (SoC) design, may degrade or introduce catastrophic error due to aggressive power cycles or high-speed operations occurring within the system. The severity of the power supply voltage droop (magnitude and duration) may be difficult to predict under some failure conditions.

Previous solutions have been implemented at the platform level. Platform-based solutions impose constraints on platform hardware components and tend to increase the cost of the system. Debug-based droop monitors are unable to predict a power supply voltage droop.

Figure 1:
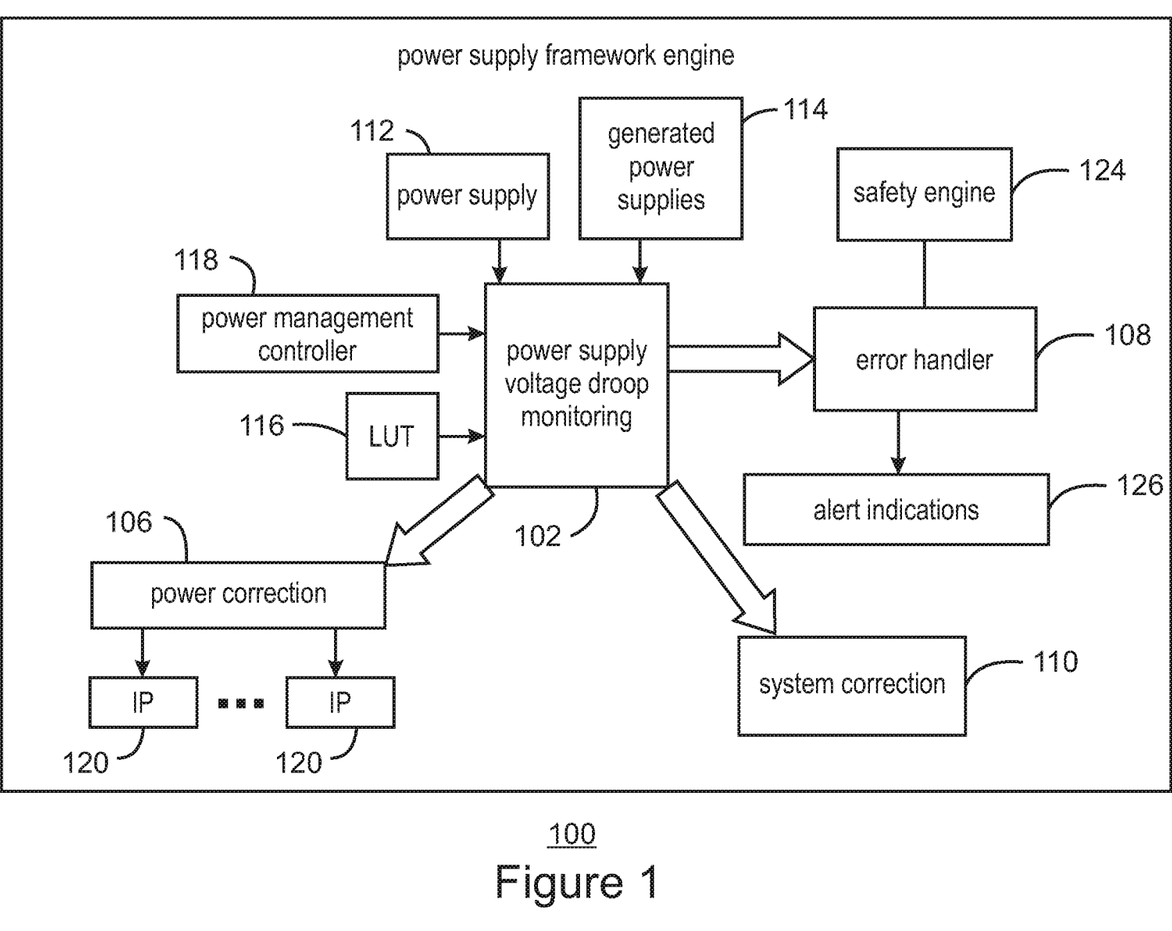
FIG. 1 is a schematic block diagram of a power supply framework engine, according to some embodiments.

FIG. 1 is a schematic block diagram of a power supply framework engine 100 to perform power supply voltage droop monitoring 102, according to some embodiments. The power supply framework engine 100 operates on a platform including a system-on-chip (SoC). In addition to the power supply voltage droop monitoring 102 detecting a voltage droop, the power supply framework engine 100 also performs power correction 106, error reporting 108, and system correction 110.

The power supply voltage droop monitoring 102 monitors the voltage droop of one or more power supplies. The voltages being monitored may include supplies external to the platform, as well as supplies derived from the external supply. The monitored supplies may include, for example, a fully integrated voltage regulator (FIVR), a low dropout regulator (LDO), and other system or internally generated power supplies. Accordingly, in FIG. 1, a power supply 112 and generated power supplies 114 are shown. The power supply voltage droop monitoring 102 monitors both amplitude and duration of the voltages from these supplies 112 and 114. When amplitude and duration of each monitored voltage exceeds those of the reference voltage and reference time, the information is sent to a system core agent, a safety engine, or both, by way of the error reporting mechanism 108.

In some embodiments, to predict voltage droop, the power supply framework engine 100 further performs power supply voltage droop monitoring 102 using a look-up table (LUT) 116 or by performing handshaking operations with a power management controller 118 to understand the power state of intellectual property (IP) sitting on particular supply domain. In semiconductor parlance, an IP core or IP block is a logical unit of the platform layout. IP blocks are diverse functional units. IP blocks may include sensors, memory and disk drive interfaces, video processors and computer graphics, modems, I/O pads, and so on.

In some embodiments, the power supply framework engine 100 further includes power correction 106, enabling the engine to take corrective action as needed in response to voltage droop detection. For example, the power correction 106 may reconfigure high-power components to be in a low-power operating state. The error reporting mechanism 108 of the power supply framework engine 100 is capable of generating and logging droop error reports, such as to the safety engine 124, also known as a safety island, of the platform. As one example, the safety engine 124 is used by application software running on the platform to configure the system under a recovery state.

In some embodiments, the power supply framework engine 100 further includes a system correction mechanism 110. Depending on the severity of the voltage droop condition, the system correction mechanism 110 may take an autonomous or asynchronous corrective action to put the system into a safe state. The system correction information may also be relayed to an end user through alert indications 126, such as audio alerts, video display messages, and so on.

Figure 2:
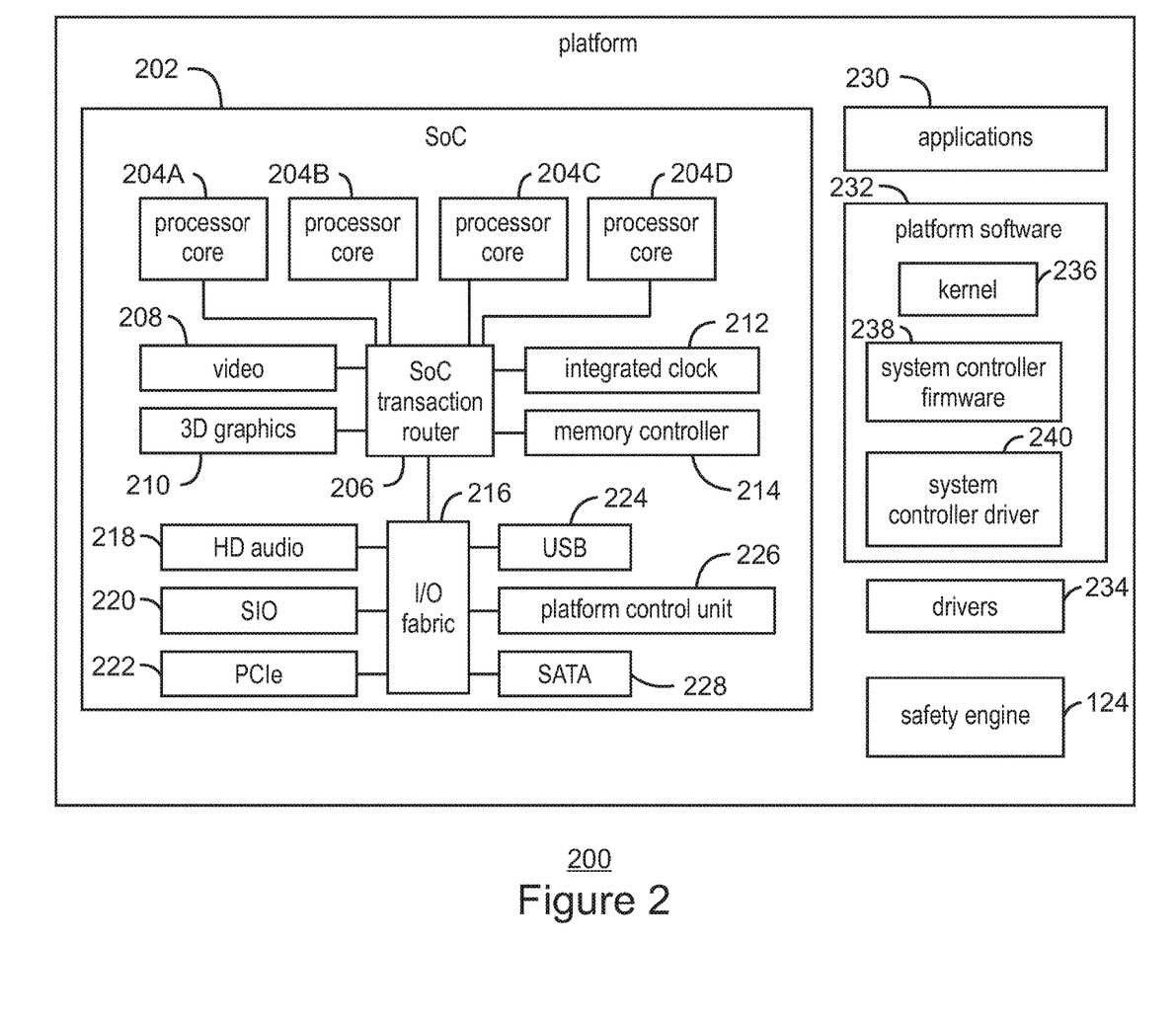
FIG. 2 is a simplified block diagram of a platform including a SoC, upon which the power supply framework engine of FIG. 1 may be implemented, according to some embodiments.

FIG. 2 is a simplified block diagram of a platform 200, including a SoC 202, upon which the power supply framework engine of FIG. 1 may be implemented, according to some embodiments. A SoC is a system that, upon a single integrated circuit (IC) or chip, integrates several functional unit that previously may have populated a printed circuit board as separate physical chips. The SoC typically includes a central processing unit (CPU), memory, I/O ports, and secondary storage on the single chip, although this may vary. The SoC referred to herein is not meant to be limiting in terms of capability, as the power supply framework engine 100 may be operable on a variety of SoCs.

The platform 200 is an example of one in which the SoC provides much of the functionality of the system. FIG. 2 provides a simplified view of both the platform and the SoC, with many features omitted for ease of illustration. The platform 200 is merely one of many different platforms in which the power supply framework engine 100 may be implemented. Thus, the platform 200 of FIG. 2 is not intended to be limiting, but to provide clarification of an operating environment for the concepts described herein.

The SoC 202 of the platform 200, includes, in this example, four processor cores 204A-204D coupled to an SoC transaction router 206. Video 208, 3D graphics 210, an integrated clock 212, and a memory controller 214, and an I/O fabric 216 are among the functional units coupled to the transaction router 206. High-definition audio 218, serial I/O 220, Peripheral Component Interconnect Express (PCIe) 222, Universal Serial Bus (USB) 224, a platform control unit 226, and Serial Advanced Technology Attachment (SATA) 228, are among the functional units coupled to the I/O fabric 216. The SoC may include additional functional units not shown in FIG. 2, such as an interrupt controller, display and camera interfaces, and so on.

In the platform 200, supporting blocks are software/firmware blocks, such as applications 230, platform software 232, and drivers 234, with the platform software further including a kernel 236, system controller firmware 238, and system controller driver 240. However, the platform may have other supporting functional blocks, depending on the application of the platform. For example, instead of or in addition to the software/firmware blocks, the platform may include a processor compiler engine, additional memory external to the SoC, such as flash or static random access memory (SRAM), additional external hard drives, and so on.

In some embodiments, external to the SoC 202, the platform 200 includes the safety engine 124. First introduced in FIG. 1, the safety engine 124 is the destination for the error reporting by the power supply framework engine 100. The safety engine 124 may be external to the SoC, such as a separate chip in communication with the SoC, or may be internal to the SoC. In FIG. 2, the safety engine 124 is external to the SoC. In some embodiments, the safety engine 124 is a centralized microcontroller responsible for getting errors from different sources and then, based on those errors, configuring the system into a recovery or safe state.

In some embodiments, the platform 200 is part of an advanced driver-assisted system (ADAS), which provides safety features to alert drivers, but also provides automatic operations. In some embodiments, the platform 200 conforms to the automotive safety integrity level (ASIL) level D, which is the most rigorous safety standard, such as providing crash protection by employing an autonomous emergency braking system, a collision avoidance system, an emergency calling system, etc. In some embodiments, the safety engine 124 monitors the health of the SoC 202 and reports to platform software 232 to take appropriate action. In a fatal operating scenario, catastrophic errors are reported to the safety engine 124 and the platform 200 is parked under a safe state or in a reset state.

In some embodiments, the power supply framework engine 100 uses an external power supply as a reference to perform early detection of power supply voltage droop, so as to ensure a safety level of the supply providing power to the platform, as well as the continued performance of the SoC. Once safety of the main supply is assured, additional supplies derived from the main supply are monitored, which ensures that the derived supplies are functionally safe. In some examples, the power supply framework engine 100 thus increases the overall safety level of the platform.

Further, in some embodiments, the power supply framework engine 100 is a self-sustained system which is not dependent on the particular platform level components, with cost savings as one possible result. Reuse of available infrastructures, such as power supply detection mechanisms, are also used along with the droop detectors disposed inside SoC, to provide effective droop detection. The proposed innovation thus helps in providing a low-cost SoC solution for various IoT group real-time systems, as well as meeting SoC safety standards.

Figure 3:
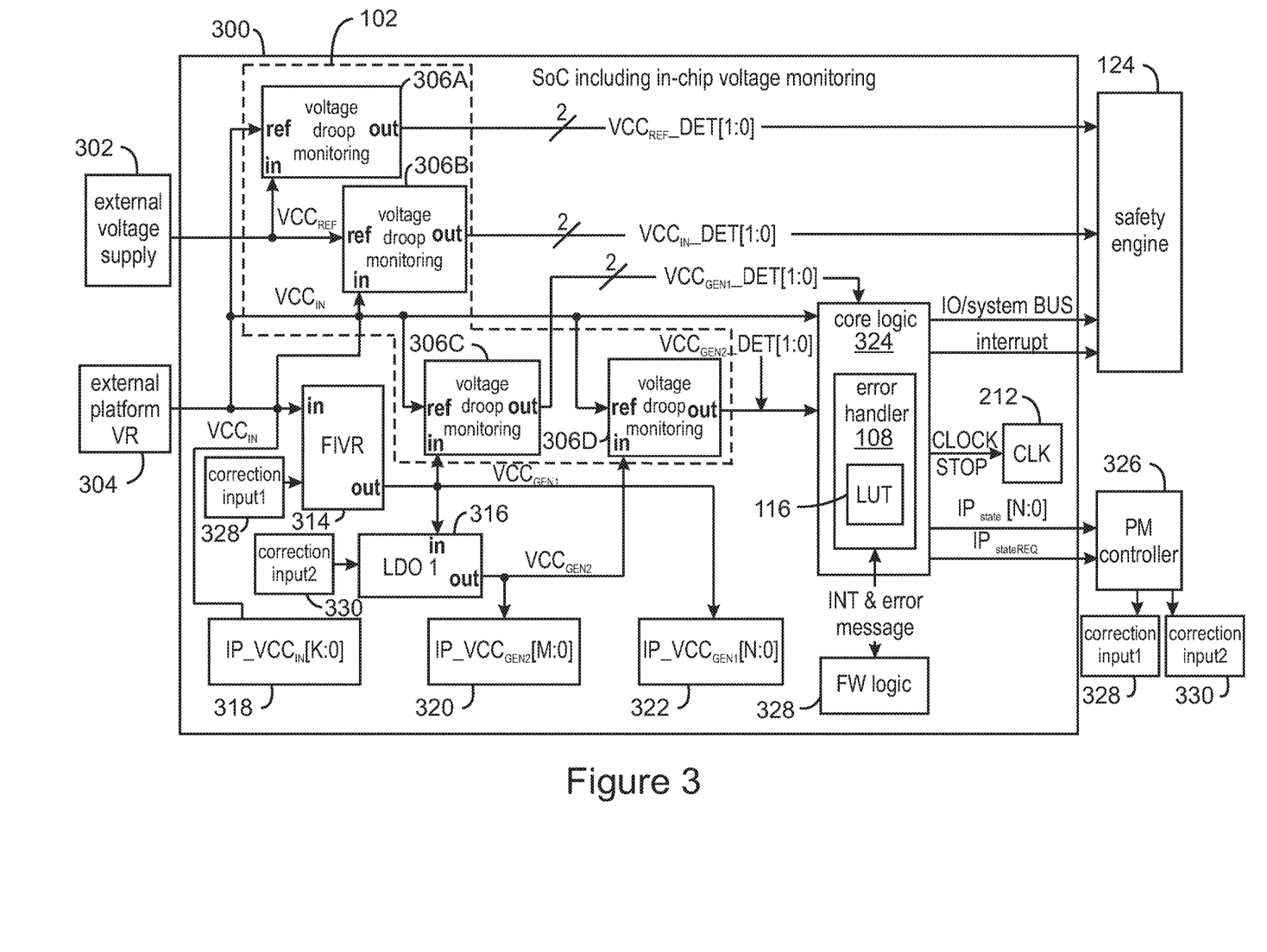
FIG. 3 is a schematic block diagram of a SoC including on-chip voltage monitoring, according to some embodiments.

FIG. 3 is a schematic block diagram of a SoC including in-chip voltage monitoring 300, according to some embodiments. The SoC 300 receives voltage from an external supply 302, and the resulting voltage, $VCC_{REF}$, is used as a reference voltage. This supply is assumed to be available even if input voltage, $VCC_{IN}$, is off. An external platform voltage regulator (VR) 304 also supplies the input voltage, $VCC_{IN}$, to the SoC 300, and this voltage, $VCC_{IN}$, is monitored for voltage droop by the voltage droop detector 306B.

In this example, the SoC 300 comprises a fully integrated voltage regulator (FIVR) 314 and a low dropout regulator (LDO) 316 to provide additional generated voltages, $VCC_{GEN1}$ and $VCC_{GEN2}$, respectively. Three voltages, $VCC_{IN}$, $VCC_{GEN1}$, and $VCC_{GEN2}$ are thus used within the SoC 300 to power various IPs of the chip. Different functional units, or IPs, of the SoC may be driven by different voltages. In this example, there are K IPs 318 receiving voltage, $VCC_{IN}$, M IPs 320 receiving voltage, $VCC_{GEN2}$, and N IPs 322 receiving voltage, $VCC_{GEN1}$, for integers K, M, and N, respectively. Although the SoC 300 is characterized by one main voltage, $VCC_{IN}$, and two internally generated voltages, $VCC_{GEN1}$ and $VCC_{GEN2}$, the principles described herein may be applied to SoCs having more than one external power supply as well as those having more than two internally generated voltages.

To monitor the three voltages, in some embodiments, the SoC 300 includes four voltage droop monitoring (VDM) circuits, 306A-306D (collectively, "voltage droop monitoring circuits" or "VDM circuits" 306). The VDM circuits 306 make up the power supply voltage droop monitoring 102 introduced in FIG. 1. The first VDM circuit 306A receives the reference voltage, $VCC_{REF}$, as its input voltage and the external VR 304 voltage, $VCC_{IN}$, as its reference voltage. The second VDM circuit 306B receives the external VR voltage, $VCC_{IN}$, as its input voltage and the reference voltage, $VCC_{REF}$, as its reference voltage. VDM 306A is monitoring reference voltage, $VCC_{REF}$, while VDM 306B is monitoring input voltage, $VCC_{IN}$. The main supply, $VCC_{IN}$, is compared with the reference supply, $VCC_{REF}$, and vice-versa. Thus, the two supplies are cross-checked with one another.

The third and fourth VDM circuits 306C and 306D receive $VCC_{IN}$ as their reference voltages. The VDM circuit 306C is monitoring $VCC_{GEN1}$ while the VDM circuit 306D is monitoring $VCC_{GEN2}$. These two VDM circuits thus check the generated voltages, $VCC_{GEN1}$ and $VCC_{GEN2}$, with respect to the main supply voltage, $VCC_{IN}$. The core logic 324 operates using the $VCC_{IN}$ supply. So, if $VCC_{IN}$ is off, the core logic will not be able to provide indication to the safety engine 124. Thus, the results of cross-checking $VCC_{REF}$ and $VCC_{IN}$ are sent to the safety engine 124.

External to the SoC 300, the PM controller logic 326 performs handshaking between various power sources of the SoC and, based on the handshaking, may disable or reconfigure one or more supplies. In response to receiving a notification from the error handler 108 in the core logic 324, the PM controller 326 may issue a first correction input 328 and a second correction input 330. The correction inputs 328 and 330 are part of the power correction 106 of the power supply framework engine 100 (FIG. 1). In some embodiments, the correction inputs 328 and 330 are fed to the FIVR 314 and LDO 316, respectively, which result in disablement or reconfiguration of the supplies. Respective voltages, $VCC_{GEN1}$ and $VCC_{GEN2}$ are thus updated or disabled based on the correction inputs. Additionally, the PM controller 326 has the capability to adjust the power state of one or more IPs of the K IPs 318, M IPs 320, and N IPs 322.

Each VDM circuit 306 generates a two-bit output based on the monitoring operations performed. Outputs $VCC_{RER}\_DET[1:0]$, $VCC_{IN}\_DET[1:0]$ are received by the safety engine 124 while $VCC_{GEN1}\_DET[1:0]$ and $VCC_{GEN2}\_DET[1:0]$ are received by core logic 324. Based on the errors determined by the voltage droop monitors, error logs are generated for the main power supplies and any supplies generated within the SoC 300. Table 1 provides error logs for $VCC_X$, where $VCC_X$ may be $VCC_{REF}$, $VCC_{IN}$, $VCC_{GEN1}$, or $VCC_{GEN2}$.

TABLE 1

| Error log for power supply ($VCC_x$) | | |
| --- | --- | --- |
| $VCC_x\_DET[1]$ | $VCC_x\_DET[0]$ | logs |
| 0 | 0 | safe power supply |
| 0 | 1 | non-fatal power supply alert |
| 1 | 0 | undefined |
| 1 | 1 | fatal power supply error |

For monitoring the droop voltage of the main supplies, the voltage droop monitor 306 detects which IPs are running on the external supply voltage, $VCC_{IN}$, which is presumed to be on, then detects when the main supply droop voltage exceeds a threshold voltage droop and threshold droop duration, the latter of which is determined by comparing the duration with a threshold code. As used herein, the threshold code is a digital code corresponding to timing information. For example, a threshold code of 111000 corresponds to 4 ns while a threshold code of 110000 corresponds to 6 ns, and so on.

In some embodiments, the voltage droop monitoring circuit 306 is a mixed signal design. Shown in more detail in FIG. 4, the operations of the voltage droop monitoring circuits 306 are clocked by the system clock, the clock 212. Using the lookup table (LUT) 116, the voltage droop monitor early predicts the droop voltage based on the number of enabled components (IPs). In some embodiments, the LUT 116 has various voltage droop information, such as thresholds of voltage droop and duration, based on the number of IPs in the SoC 300. There is also a handshaking interface with the power management (PM) controller 326 to obtain the IP power state. The IP power state indicates which IPs are active and which are idle. When the SoC is fully operational, some IPs may be active and others may nevertheless be idle. The framework engine 100 is also able to report a fatal error and provide an error log directly to the safety engine 124.

Recall from FIG. 1 that the power supply framework engine 100 includes an error handler 108, which reports to the safety engine 124. In FIG. 3, the error handler 108 is part of the core logic 324. The error handler 108 collects logs of errors, and, depending upon the severity of the error, may send an interrupt to the safety island 124. Error messages may also be sent by the error handler 108 by way of the I/O bus to the safety island. For lower severity cases in which system software is available, the two-bit indicators, such as those in Table 1, are used to configure the system under a recovery state, in some embodiments.

Alternatively, the error handler 108 may send an $IP_{state}$[N:0] or $IP_{stateREQ}$ to the power management controller 326. The $IP_{state}$[N:0] addresses the N indicated by $IP\_VCC_{GEN1}$[N:0] 322, but could also be $IP_{state}$[K:0], addressing the K IPs indicated by $IP\_VCC_{IN}$[K:0] 318 or could also be $IP_{state}$[N:0], addressing the M IPs indicated by $IP\_VCC_{GEN2}$[M:0] 320. The $IP_{state}$[N:0] (and others) indicates to the PM controller 326 which IPs to disable, following a voltage droop determination. The $IP_{stateREQ}$ indication from the error handler 108 request state information about the IPs from the PM controller 326. In one embodiment, the $IP_{state}$[N:0] and $IP_{stateREQ}$ indications prompt the PM controller 326 to issue the correction inputs 328 and 330 (FIG. 3).

Figure 4:
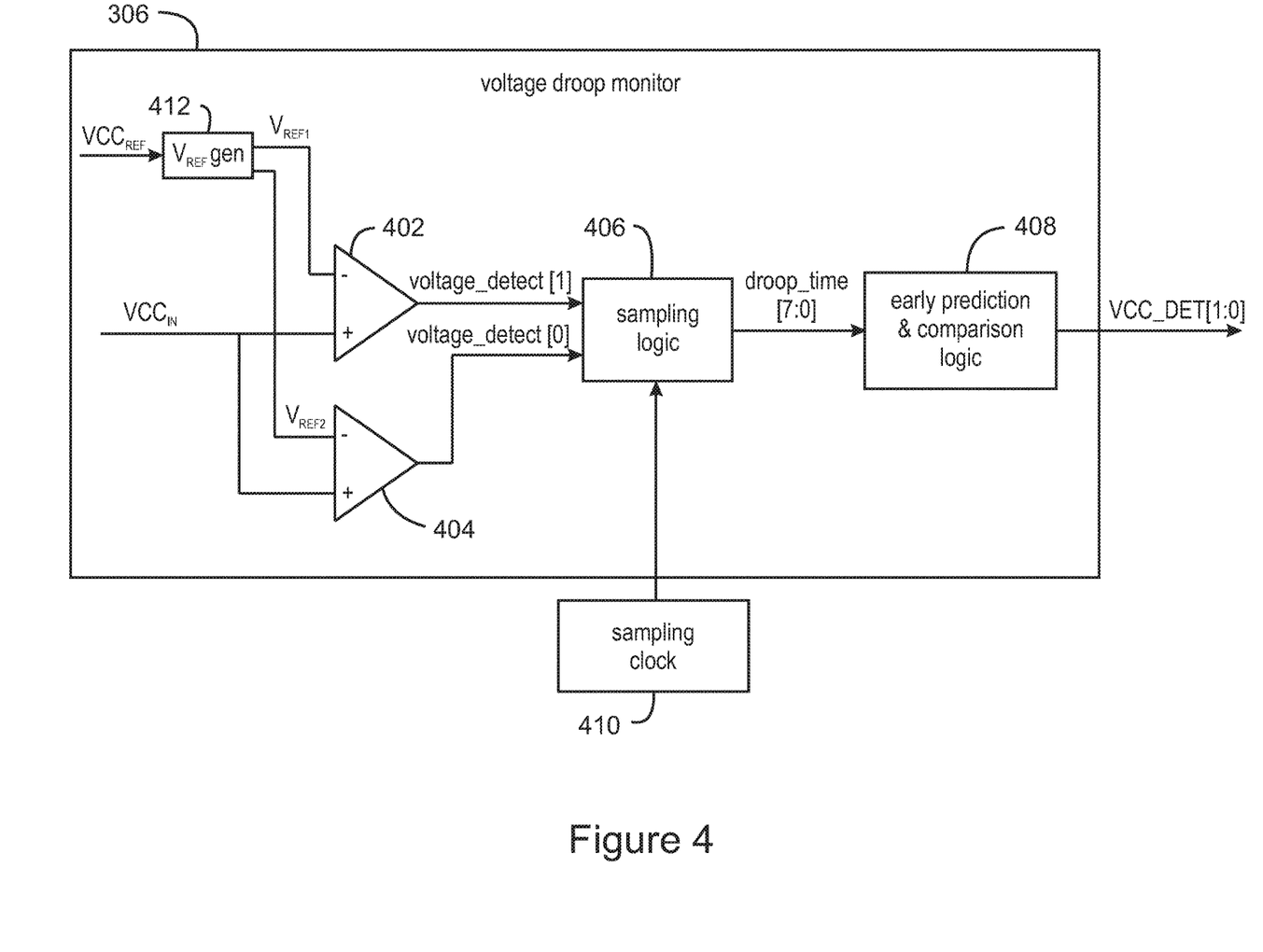
FIG. 4 is a simplified block diagram showing the voltage droop monitor of FIG. 3 in more detail, according to some embodiments.

FIG. 4 is a simplified block diagram showing the voltage droop monitor 306 of FIG. 3 in more detail, according to some embodiments. Using two reference voltages, the voltage droop monitor 306 calculates a voltage transient of the voltage being measured, in this example, $VCC_{IN}$ (although $VCC_{REF}$, $VCC_{GEN1}$ and $VCC_{GEN2}$ from FIG. 3 may also be candidates). This voltage transient is converted to a digital form. In some embodiments, based on previously collected digital samples, the voltage droop monitor calculates the slope of the voltage transient in the digital domain. Based on the slope, the trend of the voltage transient is predicted, and an early indication of the trend is sent to the safety engine, which allows for the SoC to be put in a reset or recovery state.

In one embodiment, the voltage droop monitor 306 senses with an analog sense circuit which is based on passive resistance and capacitive components to filter out high-frequency components. Reference voltage, $VCC_{REF}$, is received into a voltage divider circuit 412, resulting in two reference voltages, $V_{REF1}$ and $V_{REF2}$ which define the thresholds to measure the input voltage against. Analog comparator 402 receives the input voltage, $VCC_{IN}$, and the first reference voltage, $V_{REF1}$, while analog comparator 404 receives the input voltage, $VCC_{IN}$, and the second reference voltage, $V_{REF2}$. In some embodiments, these comparators 402 and 404 are low-power latch-based comparators. In other embodiments, an analog-to-digital (A/D) converter is used to generate the two reference voltages. The output from the comparator 402, given as voltage_detect[1], and the output from the comparator 404, given as voltage_detect[0], are received into sampling logic 406. Voltage_detect[0:1] is the digital form of the voltage droop.

The sampling circuit 406 receives a clock input from a sampling clock 410, which may be the SoC clock 212 (FIG. 3). In some embodiments, the sampling clock 410 is a high-speed clock of at least 400 MHz. In other embodiments, the sampling clock 410 is a ring oscillator. This embodiment shows two comparators, but it possible to extend the voltage droop monitor 306 to include multiple comparators (depending on power needs and available area), such as to enable a finer granularity of supply detection.

The two outputs of the comparators 402 and 404 are sampled by the sampling circuit 406, which generates the 8-bit droop_time[7:0]. The sampling logic 406 thus measures the duration of the power supply droop voltage. The input, droop_time[7:0], is the duration of the droop information in the digital domain, and is received as input to early prediction and comparison logic 408. The early prediction and comparison logic 408 performs prediction based on past sampled output, and, from this, is able to calculate the slope of the voltage droop. Outputs are predicted based on a current voltage code, as well as the slope of the droop code, and then errors are generated based on the outputs.

The early prediction and comparison logic 408 generates a two-bit output, VCC_DET[1:0]. Recall from FIG. 3 that each voltage droop monitor 306 generates a two-bit output. Voltage droop monitor 306A generates $VCC_{REF}\_DET[1:0]$; voltage droop monitor 306B generates $VCC_{IN}\_DET[1:0]$; voltage droop monitor 306C generates $VCC_{GEN1}\_DET[1:0]$; and voltage droop monitor 306D generates $VCC_{GEN2}\_DET[1:0]$. Thus, the output shown in FIG. 4 is a generalized version of these outputs.

Figure 5:
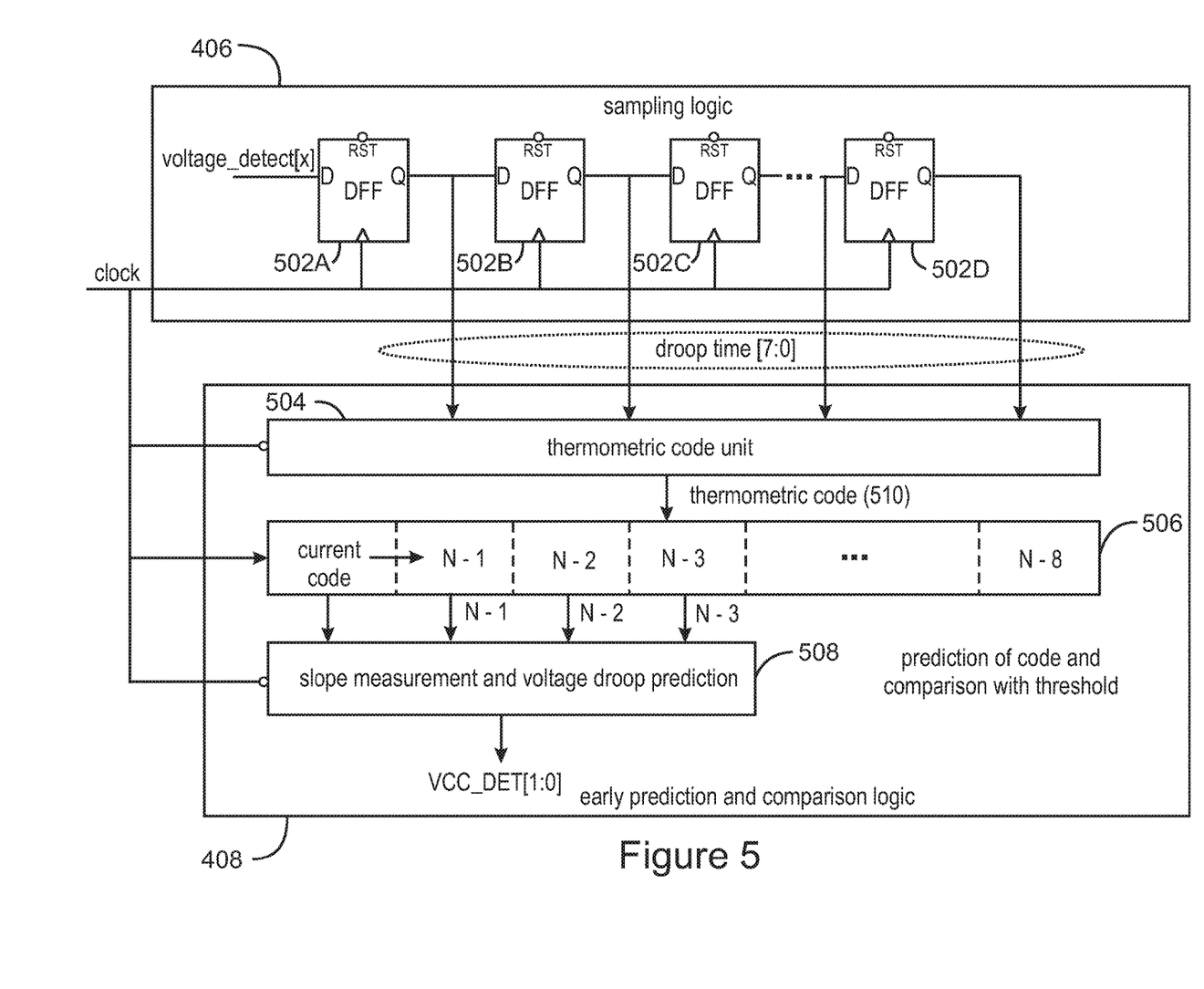
FIG. 5 is a simplified block diagram showing the sampling logic and early prediction and comparison logic of the voltage droop monitor of FIG. 4, according to some embodiments.

FIG. 5 is a simplified block diagram showing the sampling logic and early prediction and comparison logic of the voltage droop monitor of FIG. 4 in more detail, according to some embodiments. The sampling logic 406 includes N D flip-flops, for integer N, with D flip-flops 502A, 502B, 502C, . . . , and 502D showing (collectively, "D flip-flops 502").

The D flip-flops 502 measure the duration of the monitored voltage droop. Each of the two-bit inputs of the input, given by voltage_detect[0] and voltage_detect[1], is tested separately. In some embodiments, these two inputs are detected simultaneously. Thus, in some embodiments, there are two arrays of D flip-flops 502 in the sampling logic 406, one for voltage_detect[1] and one for voltage_detect[0].

After simultaneous testing of voltage_detect[1] and voltage_detect[0] has taken place in respective arrays of D flip-flops, the output is an 8-bit droop duration, given by droop_time[7:0], which is received into the early prediction and comparison logic 408.

The early prediction and comparison logic 408 receives the droop duration information, given by droop_time[7:0], into a thermometric code 510. A thermometric code is a type of unary code in which a single bit changes at a time. Here, the 8-bit droop_time[7:0] is converted to an 8-bit thermometric value 510, indicating the duration of the droop, in the thermometric code unit 504. The thermometric value 510 is compared with a threshold code, with the threshold code also representing a time duration. A threshold code of 111000 may, for example, represent a 4 ns time duration while a threshold code of 110000 may represent a 6 ns time duration.

The next unit of the early prediction and comparison logic 408 is a storage unit 506, such as a first-in-first-out (FIFO). The storage unit 506 stores the thermometric code 510 and does so at each clock cycle. In this example, the storage unit 506 stores up to eight thermometric codes. Thus, the current thermometric code is stored, as well as the thermometric code at time N−1, the thermometric code at time N−2, and so on until the thermometric code at time N−8 is stored. As shown in FIG. 5, the storage unit 506 may store up to eight thermometric codes of two sampled voltage detect bits, each one representing the droop time duration in succeeding clock cycles.

Some of the thermometric codes are sent to a slope measurement and voltage droop detection unit 508. In this example, the four most recent thermometric codes, for four successive time periods, are sent to the comparison unit 508.

In some embodiments, thermometric codes 510 are plugged into the following formula:

$$V[n+1]=V[n]+m*dt>V_{threshold} \qquad (1)$$

where m is the slope and dt is the duration of the droop. A future voltage or voltage trend, given by V[n+1], is thus being calculated.

In one embodiment, the following formula uses four digital samples to predict a voltage droop trend:

$$V[n+1]=V[n]+dt*(V[n-4]-V[n-1])/4>V_{threshold} \qquad (2)$$

The formula (2) predicts the voltage trend, first (V[n−1]) and fourth (V[n−4]) digital samples received. If the result of this calculation is greater than the threshold voltage, $V_{threshold}$, then the output is a 1, otherwise, the output is a 0. The output of the comparison unit 508 is two bits, given by VCC_DET [1:0].

Figure 6A:
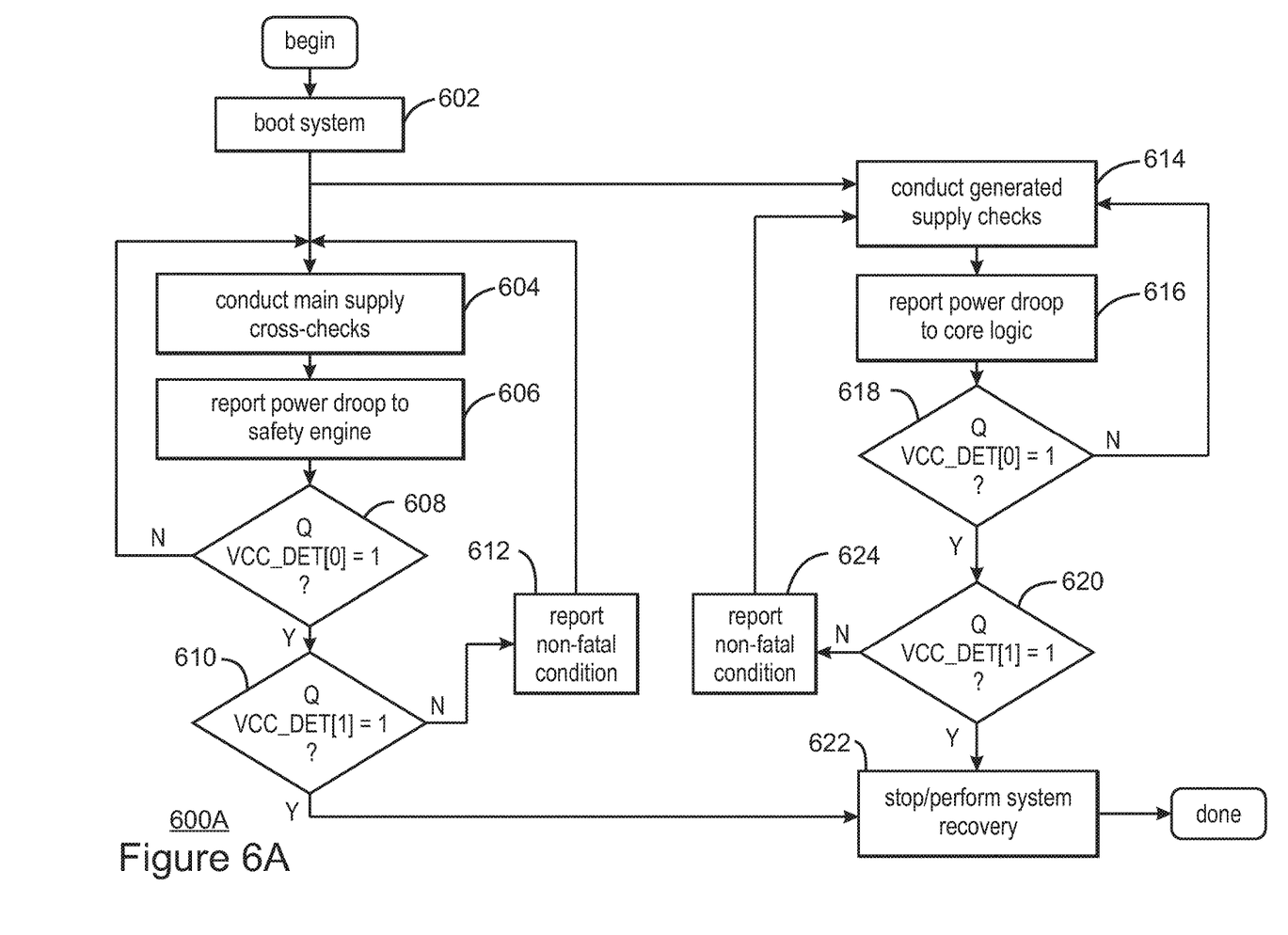
FIG. 6A is a flow diagram illustrating operation of the power supply framework engine of FIG. 1, according to some embodiments.

FIG. 6A is a flow diagram illustrating operation 600A of the power supply framework engine 100, according to some embodiments. The operations begin as the system is powered on or booted (block 602). The system may be a platform including a SoC, such as the platform 200 in FIG. 2, where the SoC may be the SoC 300 of FIG. 3, which includes the in-chip voltage monitoring. Main supply cross-checks are conducted, such as by the voltage droop monitoring circuit 306A and 306B (block 604). Any detected power supply voltage droop is reported to the safety engine (block 606).

Recall from FIG. 3 that the voltage droop monitoring circuits 306 produce a two-bit output, given by VCC_DET [1:0], where circuit 306A generates $VCC_{REF}\_DET[1:0]$ based on monitoring $VCC_{REF}$ and circuit 306B generates $VCC_{IN}\_DET[1:0]$ based on monitoring $VCC_{IN}$. In some embodiments, these two voltage supplies would be checked separately. For each voltage supply, the operations 600A thus proceed to test these bits. Table 1 shows how the bits are to be interpreted, in one embodiment. If the first bit, VCC_DET[0], is 0, then the main power supplies are considered safe (the "no" prong of query 608), and the process of conducting the main supply cross checks is repeated. Otherwise, a further check is made of the second bit, VCC_DET[1] (query 610). If the second bit is a zero, this is the "01" condition of Table 1, and a non-fatal condition of the power supply, is reported (block 612). Again, the process of conducting main supply cross checks is repeated, as the monitoring operations are ongoing, in some embodiments, once the system is booted. If, instead, the second bit is a one, then the "11" condition of the two bits indicates that a fatal error of the power supply has occurred (the "yes" prong of query 610). The system is stopped or system recovery is performed (block 622).

Where the main power supply is deemed safe, control proceeds to check the status of the generated power supplies (block 614). Although the main supplies are checked before the generated supplies in FIG. 6A, these operations may take place in reverse. Thus, control may instead proceed directly to block 614 from the system boot at block 602. Once the generated supplies are checked, any detected power supply voltage droop is reported to the core logic (block 616). As with the main power supply, the two-bit output of each voltage droop monitoring circuit is tested. In the example of FIG. 3, the VDM 306C generates $VCC_{GEN1}\_DET[1:0]$ based on monitoring $VCC_{GEN1}$ and the VDM 306D generates $VCC_{GEN2}\_DET[1:0]$ based on monitoring $VCC_{GEN2}$. In some embodiments, each generated supply is checked separately. For each generated supply, if VCC_DET[0] is not set (the "no" prong of query 618), then the supply is considered safe, and the generated power supplies may again be checked (block 614), as the monitoring operations are ongoing. Otherwise, the VCC_DET[1] bit of the respective generated supply is checked (block 620). If the second bit is not set (the "no" prong of query 620), a non-fatal condition of that supply is reported (block 624). Otherwise, a fatal error of the generated power supply is detected, and the system is stopped or a system recovery is performed (block 622).

Figure 6B:
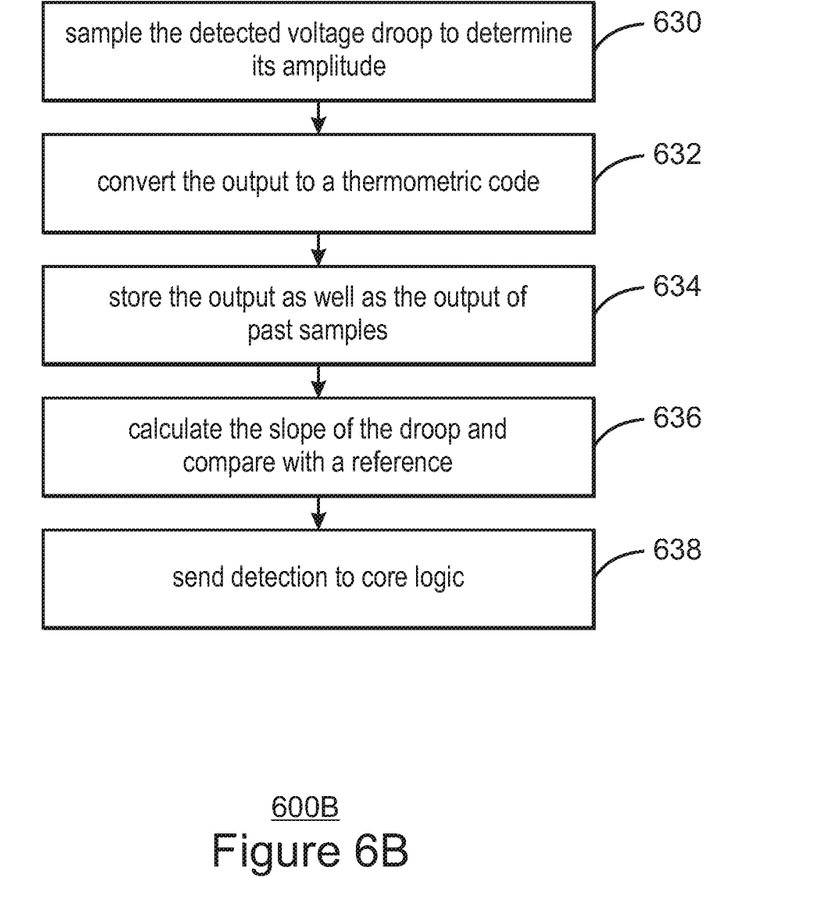
FIG. 6B is a flow diagram illustrating operation of the voltage droop monitoring circuit of FIGS. 4 and 5, according to some embodiments.

FIG. 6B is a flow diagram illustrating operations 600B of the voltage droop monitoring circuit of FIGS. 4 and 5, according to some embodiments. The operations 600B begin by sampling the detected voltage droop to determine its amplitude (block 630). In FIG. 5, the sampling is performed by D flip-flops, but other digital logic may be used to obtain the voltage droop duration (given by droop_time[7:0] in FIGS. 4 and 5). The sampled data is then converted to a thermometric code (block 632). The thermometric code, as well as previously obtained thermometric codes are stored, such as in a memory, registers, a FIFO, and so on (block 634). From these data, the slope of the droop is calculated and compared with a reference (block 636). Thus, how steep the droop, such as the droops 902, 904, and 906 in FIG. 9 and droops 1002, 1004, and 1006 in FIG. 10, is calculated. In one embodiment, the formula (1), above, is used to calculate the slope. In a second embodiment, the formula (2), above, is used to calculate the slope. Once the slope is calculated, the information is sent to the core logic for further processing (block 638). Performed by the error handler 108 inside the core logic 324 (FIG. 3), the further processing may include alert indications 126, system correction 110, and IP power correction 106 (FIG. 1).

Figure 7:
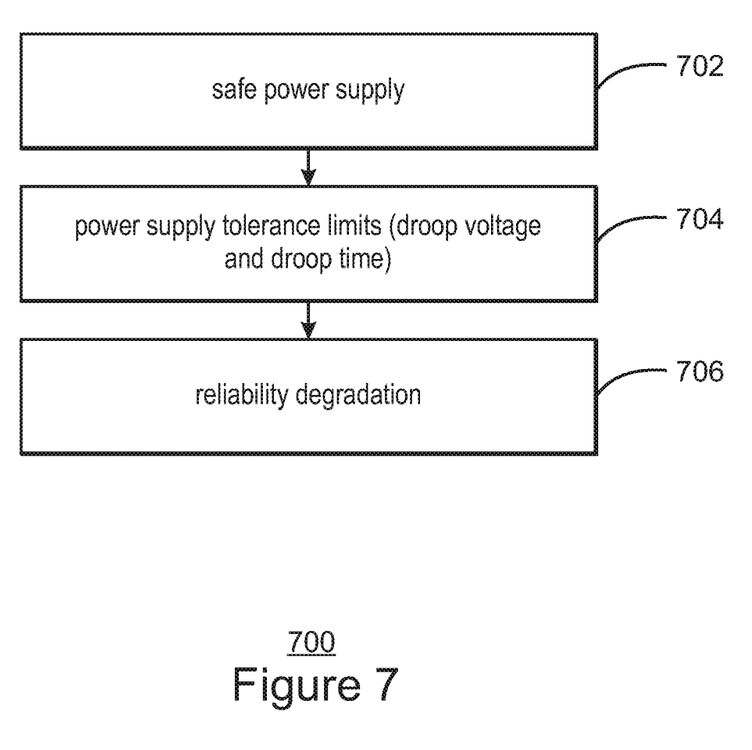
FIG. 7 is a simplified block diagram showing parameters that are checked by the power supply framework engine of FIG. 1, according to some embodiments.

FIG. 7 is a simplified block diagram showing characteristics that are maintained by the power supply framework engine 100, according to some embodiments. The power supply framework engine 100 ensures a safe power supply 702, by continuously testing both the external and generated power supplies to ensure they are within safe operating limits. The power supply framework engine 100 also ensures power supply tolerance limits 704 are satisfied by monitoring whether any voltage droops, including both droop voltage and droop time, are within or under the limits, such as those specified by the manufacturer. The power supply framework engine 100 also provides for reliability degradation 706, by including indications as well as quantifying the aging degradation of the monitored power supplies. In some embodiments, interrupts and error logs are generated by the power supply framework engine 100 in support of these parameters.

Figure 8:
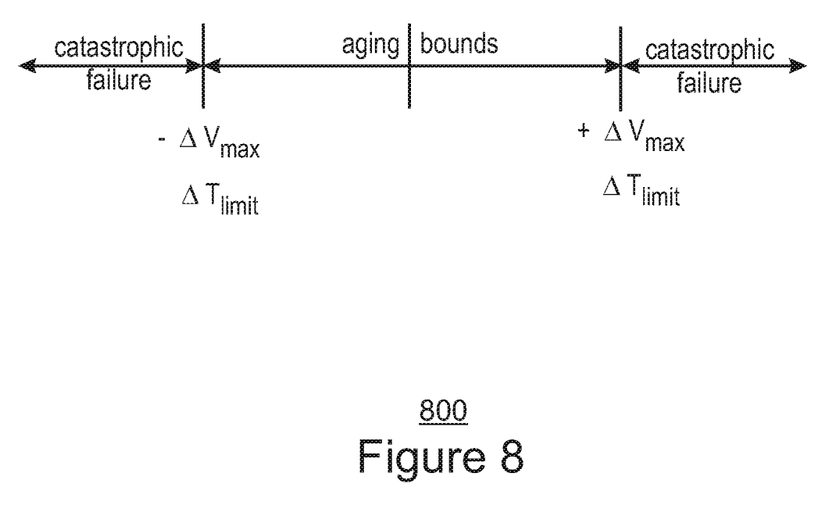
FIG. 8 is a simplified diagram showing how the power supply framework engine of FIG. 1 deals with the aging of the power supply, according to some embodiments.

FIG. 8 is a simplified diagram showing how the power supply framework engine 100 deals with the aging of the power supply, according to some embodiments. Vertical lines indicate a maximum voltage change ($\Delta V_{max}$) and time duration ($\Delta T_{limit}$), outside of which indicates a catastrophic failure of the power supply. The left vertical line indicates a negative maximum voltage change ($-\Delta V_{max}$) and time duration ($\Delta T_{limit}$), beyond which catastrophic failure of the power supply is likely to occur. The right vertical line indicates a positive maximum voltage change ($+\Delta V_{max}$) and time duration ($\Delta T_{limit}$), beyond which catastrophic failure of the power supply is likely to occur. The center vertical line indicates typical operation. The bounds are the limit that the power supply can tolerate and aging indicates that the power supply is aging. As the system components, including the power supply, age, the tolerance limit of the droop voltage, given by $-\Delta V_{max}$ and $+\Delta V_{max}$, for time duration $\Delta T_{limit}$, will change. In some embodiments, a monotonic movement of digital code indicates that the circuit is degrading. For example, a droop voltage digital code of 00111000 may be measured in a first time period. In a succeeding time period, the droop voltage digital code of 00111100 indicates that the voltage droop pulse width has increased (more 1s in the code indicate a longer duration of the droop). Although the voltage droop monitoring detects voltage undershoot or droop, the voltage monitoring circuit may also detect voltage overshoot.

Figure 9:
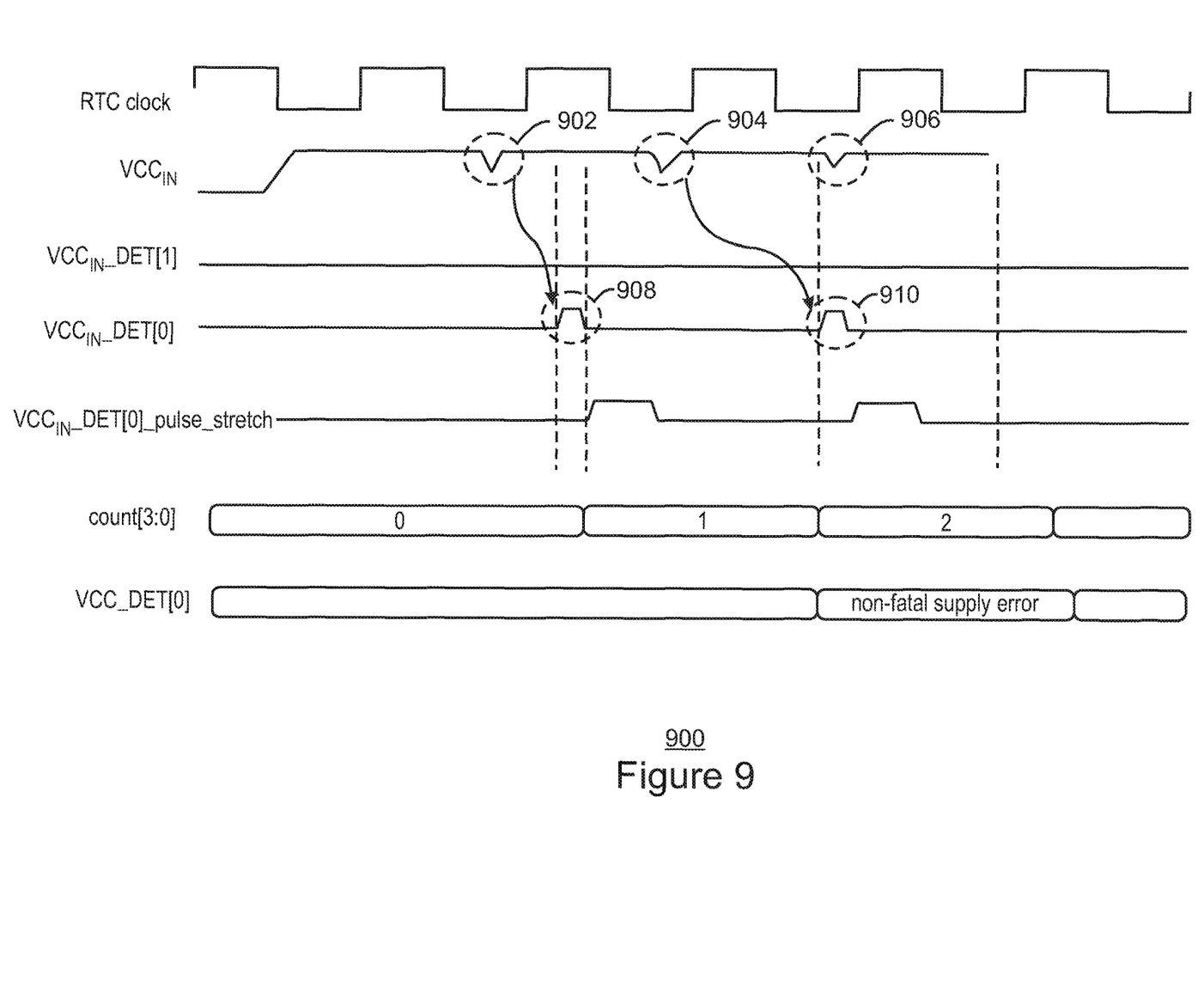
FIGS. 9 and 10 are timing diagrams showing operation of a voltage droop monitoring circuit used by the power supply framework engine of FIG. 1, according to some embodiments.
Figure 10:
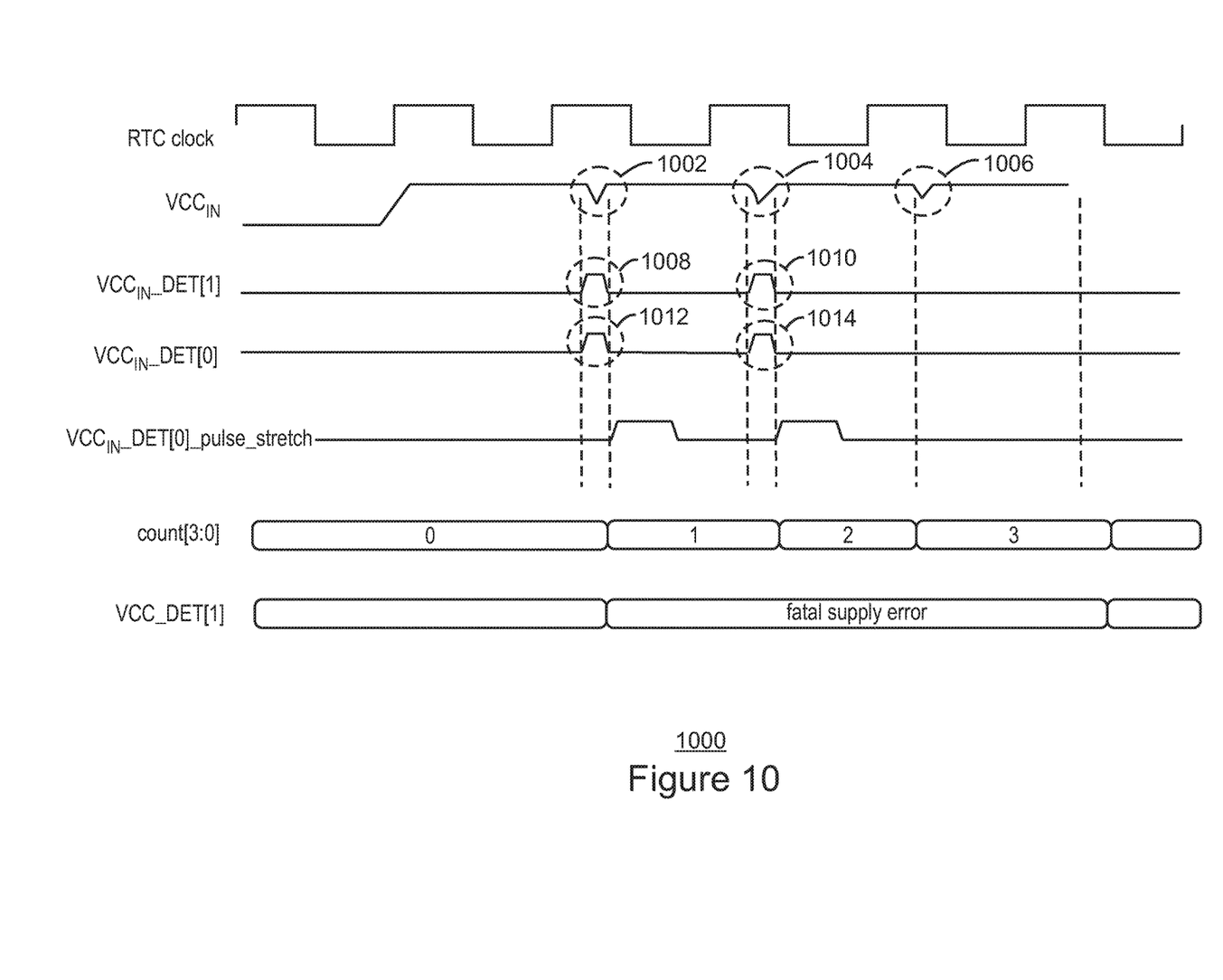

FIGS. 9 and 10 are timing diagrams showing operation of a single voltage droop monitoring circuit, such as the voltage droop monitoring circuit 306 of FIG. 3, which is part of the power supply voltage droop monitoring 102 of the power supply framework engine 100 of FIG. 1. In both timing diagrams, the voltage, $VCC_{IN}$, is being monitored for voltage droop, although the principles described herein may apply to other source supplies, such as $VCC_{REF}$, as well as generated supplies, such as $VCC_{GEN1}$ and $VCC_{GEN2}$.

Monitoring the voltage, $VCC_{IN}$, a first voltage droop 902 is indicated. As described above, the detection of a voltage droop causes the voltage droop monitoring circuit to generate a two-bit output, $VCC_{IN\_}DET[0:1]$. The voltage droop 902 causes the second and third voltage droops 904 and 906 also occur, but, in this example, the droop 906 is not detected by the comparator and thus no pulse occurs at $VCC_{IN\_}DET[0]$. Although the $VCC_{IN\_}DET[1]=1$, $VCC_{IN\_}DET[0]=0$. Thus, there is no fatal error.

$VCC_{IN\_}DET[1]$ pulse 908 and 910 correspond to voltage droops 902 and 904, respectively. The D flip-flops 502 of sampling logic 406 (FIG. 5) measure the width of these pulses, given by droop_time[7:0].

In both figures, there is a pulse-stretched version of the signal, $VCC_{IN\_}DET[0]$. There is also a 4-bit counter that counts the occurrences of the voltage droop of $VCC_{IN}$. Thus, in FIG. 9, the counter counts three occurrences of the voltage droop.

In FIG. 10, there are also three voltage droop signals 1002, 1004, and 1006. The subsequent two-bit output generated by the voltage droop monitoring circuit are given by the pulses 1008 and 1012 for the first voltage droop signal 1002, and by pulses 1010 and 1014 for the second voltage droop signal 1004. The D flip-flops of the sampling logic (FIG. 5) measure the width of the pulses. In this case, both the $VCC_{IN\_}DET[1]=1$ and $VCC_{IN\_}DET[0]=1$. The counter counts the three voltage droops 1002, 1004, and 1006. There is no corresponding pulse for the third voltage droop 1006 because the droop is small enough to not be detected by the comparator (FIG. 4). Thus, there is a fatal error.

The voltage droop monitor described herein measures the voltage droop and compares it with a threshold code, in which the threshold code corresponds to a targeted millivolt droop. FIG. 1 illustrates the power supply framework engine 100, including power supply voltage droop monitoring 102. FIG. 3 expands on the power supply voltage droop monitoring by showing voltage droop monitoring circuits as part of a SoC. FIGS. 4 and 5 provide more details of how the voltage droop monitor operates, which monitors for voltage droop and tolerance limits. FIG. 6A provides operational details of the power supply voltage droop monitoring.

While the foregoing examples are illustrative of the principles in one or more particular applications, it will be apparent to those of ordinary skill in the art that numerous modifications in form, usage, and details of implementation can be made without the exercise of inventive faculty, and without departing from the principles and concepts herein and will appreciate numerous modifications and variations therefrom. It is intended that the appended claims cover all such modifications and variations as fall within the true spirit and scope of the disclosed embodiments.

We claim:

1. A system-on-a-chip (SoC) to receive a reference voltage from a first external voltage supply and an input voltage from a second external voltage supply, the SoC comprising:
a first voltage droop monitoring circuit to monitor the input voltage, the first voltage droop monitoring circuit to receive a second voltage as its reference voltage;
a plurality of intellectual property (IP) units operable via the input voltage;
a second voltage droop monitoring circuit to monitor the second voltage, the second voltage droop monitoring circuit comprising the input voltage as its reference voltage; and
a power correction unit to adjust power to one or more of the plurality of IP units in response to an input voltage droop of the input voltage being predicted by the first voltage droop monitoring circuit.

2. The SoC of claim 1, further comprising a third voltage droop monitoring circuit to monitor a third voltage droop of a third voltage, the third voltage droop comprising the input voltage as its reference voltage, wherein the third voltage is to be generated inside the SoC.

3. The SoC of claim 1, the first voltage droop monitoring circuit further comprising sampling logic to measure a time duration of the input voltage droop, the sampling logic comprising a plurality of flip-flops, wherein an indication is sent to a safety engine in response to the input voltage droop.

4. The SoC of claim 3, wherein the safety engine is external to the SoC.

5. The SoC of claim 4, wherein the safety engine configures a system comprising the SoC under a recovery state.

6. The SoC of claim 2, wherein an indication is sent to a core logic of the SoC in response to the third voltage droop.

7. The SoC of claim 2, the third voltage droop monitoring circuit further comprising sampling logic to measure a time duration of the third voltage droop and comparison logic to receive the time duration from the sampling logic and predict whether the third voltage droop is maintained.

8. A power supply framework engine comprising:
a first voltage droop monitoring (VDM) circuit to detect a first droop of a first voltage supplied to a SoC, the first voltage to further power a plurality of intellectual property (IP) units within the SoC, wherein the first VDM circuit uses a second voltage as its reference voltage;
a second VDM circuit to detect a second droop of the second voltage supplied to the SoC, wherein the second VDM circuit uses the first voltage as its reference voltage, wherein the first voltage and second voltage are cross-checked by the first and second VDMs, resulting in an indication in response to the first droop exceeding a threshold duration;
an error handler to transmit the indication to a safety engine, wherein the safety engine is external to the SoC; and
a power correction unit to turn off one or more of the plurality of IP units of the SoC in response to receiving the indication.

9. The power supply framework engine of claim 8, further comprising:
a third VDM circuit to detect a third droop of a third voltage, the third voltage being generated internal to the SoC, wherein a second plurality of IP units is powered by the third voltage.

10. The power supply framework engine of claim 9, the third VDM circuit further comprising:
   sampling logic to receive a digitized version of the third droop and, from the digitized version, measure a duration of the third droop.

11. The power supply framework engine of claim 10, the third VDM further comprising:
   early prediction logic to:
      convert the duration to a thermometric code; and
      compare the thermometric code to previously received thermometric codes.

12. The power supply framework engine of claim 11, the early prediction logic to calculate a trend of the third voltage droop using the formula $V[n+1]=V[n]+m*dt>V_{threshold}$, where m is the slope, dt is the duration of the third voltage droop, and $V_{threshold}$ is a threshold voltage of the third voltage droop.

13. The power supply framework engine of claim 9, further comprising:
   a power management controller to monitor a power state of the second plurality of IP units of the SoC, wherein the power state is either idle or active.

\* \* \* \* \*